(12) United States Patent
Bross

(10) Patent No.: US 6,914,289 B2
(45) Date of Patent: Jul. 5, 2005

(54) HOURGLASS RAM

(75) Inventor: Kevin W. Bross, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 99 days.

(21) Appl. No.: 10/222,095

(22) Filed: Aug. 15, 2002

(65) Prior Publication Data

US 2004/0031974 A1 Feb. 19, 2004

(51) Int. Cl.$^7$ ............................................. H01L 29/788
(52) U.S. Cl. .................... 257/316; 257/315; 257/317; 257/309; 257/213
(58) Field of Search ................................. 257/315, 316, 257/317, 309, 213

(56) References Cited

U.S. PATENT DOCUMENTS

| | | | | |
|---|---|---|---|---|
| 5,763,913 A | * | 6/1998 | Jeong | 257/316 |
| 6,093,604 A | * | 7/2000 | Jeong | 438/257 |
| 6,211,531 B1 | | 4/2001 | Nakazato et al. | |
| 6,297,989 B1 | * | 10/2001 | Cloud et al. | 365/185.08 |
| 6,574,143 B2 | * | 6/2003 | Nakazato | 365/185.18 |

FOREIGN PATENT DOCUMENTS

| WO | WO 00/70675 | 5/1999 |
|---|---|---|
| WO | WO 01/06570 A1 | 1/2001 |

* cited by examiner

*Primary Examiner*—Anh Phung
*Assistant Examiner*—Doug Menz
(74) *Attorney, Agent, or Firm*—Lanny L. Parker

(57) ABSTRACT

An integrated circuit having a non-volatile HGRAM cell includes a first section having impurity materials implanted into a substrate to form NPN transistor regions and a second section having a gate structure to control the currents conducted in the NPN transistor regions. The gate structure is formed at least above the P-type channel region of the substrate and includes an hourglass shaped material with gates to control the movement of holes through the restricted portion of the hourglass.

16 Claims, 2 Drawing Sheets

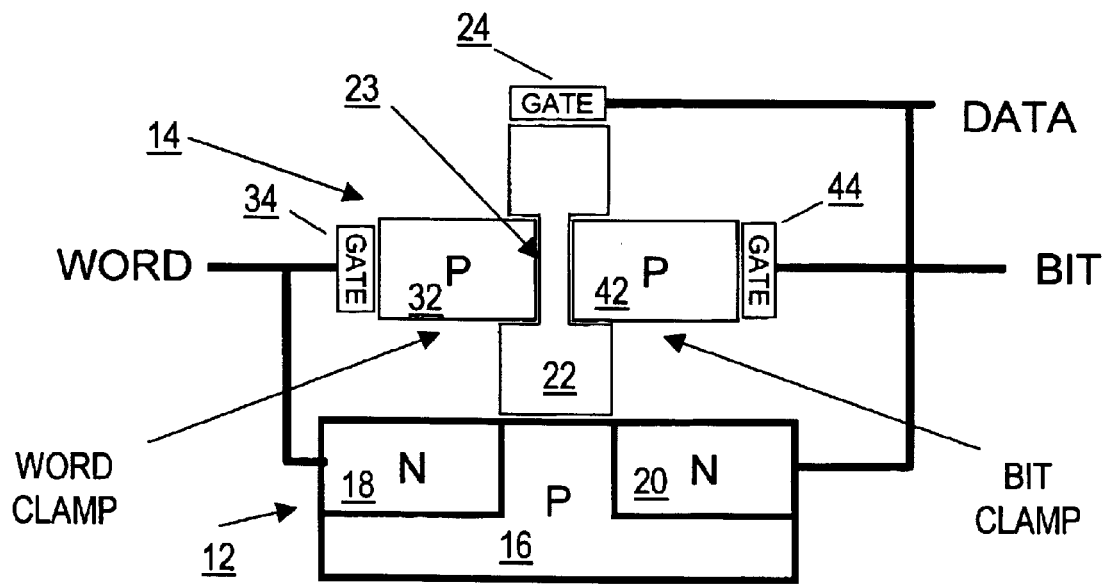
Fig. 1            10
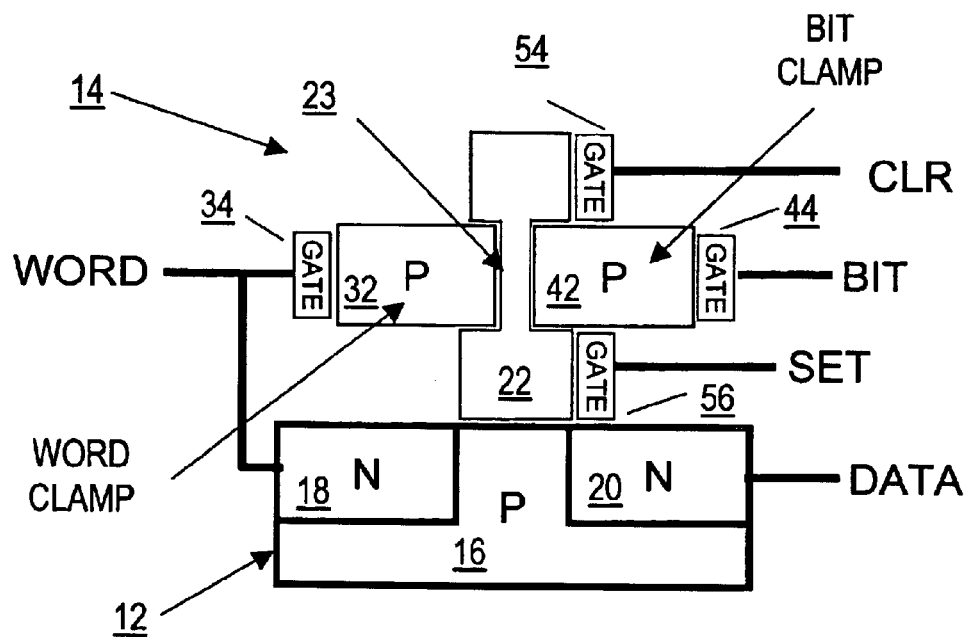
Fig. 2            50

HOURGLASS RAM

The size and complexity of designs that may be implemented in hardware has increased dramatically due to the high degree of miniaturization possible today in semiconductor technology. This has made it technologically feasible and economically viable to develop high-speed application-specific architectures featuring a performance increase over previous architectures. Memory cell technology plays a key part in the effort to lower product costs, while providing continued improved performance in data storage.

There are several different memory technologies prevalent in electronic systems today. Dynamic Random Access Memories (DRAMs) store data using a capacitor to retain a charge, and although the DRAMs are simple and fast, the stored data is not preserved when power is lost and frequent refreshing is required to retain the content of the memory. Numerous types of non-volatile memory such as Flash or ferroelectric memory are also available. Flash memory eliminates the refresh and volatility issues by embedding a floating gate under the standard control gate. The floating gate may be programmed through the use of hot electron injection and/or tunneling to store and indefinitely retain a charge on that gate. However, this non-volatile feature comes at a cost, requiring a separate erase cycle, high programming/erase voltages, block-level erasure, a durability limitation on the number of write cycles, and longer write times due to tunneling overhead.

Accordingly, there is a need for a memory cell technology that is non-volatile, low power, and manufacturable with standard process technologies that provide flexibility for operating a microprocessor.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 1 illustrates a non-volatile HGRAM cell in accordance with an embodiment of the present invention;

FIG. 2 is another embodiment of the HGRAM cell in accordance with an embodiment of the present invention.

Figure 3:
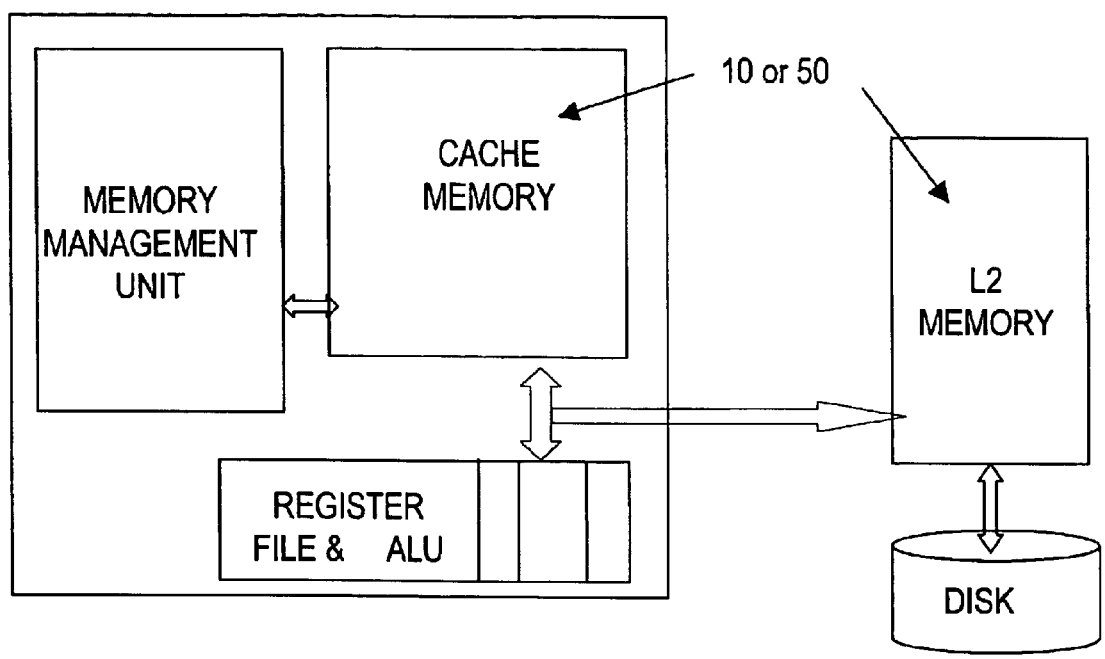
FIG. 3 illustrates the use of the HGRAM memory in a computer system.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Embodiments of the present invention may be used in a variety of applications. Although the present invention is not limited in this respect, the circuits disclosed herein may be used in microcontrollers, general-purpose microprocessors, Digital Signal Processors (DSPs), Reduced Instruction-Set Computing (RISC), Complex Instruction-Set Computing (CISC), among other electronic components. However, it should be understood that the scope of the present invention is not limited to these examples.

Embodiments of the present invention may also be included in integrated circuit blocks referred to as main memory, cache memory, or other types of memory that store electronic instructions to be executed by the microprocessor or store data that may be used in arithmetic operations. In general, an embodiment using the hourglass memory in accordance with the claimed subject matter may be incorporated into a memory array that is embedded in microprocessors, or used in a stand-alone memory device. Note that the claimed subject matter may be used in applications that are integrated into radio systems or hand-held portable devices, especially when devices depend on reduced power consumption. Thus, laptop computers, cellular radiotelephone communication systems, two-way radio communication systems, one-way pagers, two-way pagers, personal communication systems (PCS), personal digital assistants (PDA's), cameras, solid state disk/storage devices (fixed or removable), and other products are intended to be included within the scope of the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Turning to FIG. 1, a non-volatile HourGlass Random Access Memory (HGRAM) cell 10 is illustrated having two sections. A first section 12 includes impurity materials implanted into a substrate 16 that may be used to form NPN transistor regions. In particular, the N-type impurity material implanted into regions 18 and 20 of substrate 16 forms respective source and drain regions for a Metal Oxide Semiconductor (MOS) or field effect device. Source and drain regions 18 and 20 are physically spaced apart by a P-type channel region of substrate 16. A second section 14 includes a gate structure used to control the currents conducted in the NPN transistor regions. The gate structure is formed at least above the P-type channel region of substrate 16 and includes terminals to receive a WORD select line, a BIT line, and a DATA value. Although the figures and description reference NPN transistor regions, one skilled in the art would recognize that PNP transistor regions would also be applicable.

The gate structure includes a polysilicon semiconductor material 22 having an hourglass shape and lightly doped to have a positive charge. One end of material 22 is formed above the channel region of substrate 16, with the other end connected to a gate 24 for receiving the DATA value. Additionally, a semiconductor material 32 in combination with a gate 34 forms a word clamp and a bit clamp is formed by a semiconductor material 42 in combination with a gate 44. Materials 32 and 42 may both be formed from a polysilicon material that is deposited subsequent to forming material 22, with materials 32 and 42 being heavily doped to provide a strong positive charge. In one embodiment materials 32 and 42 have P-type impurities. A thin insulating material separates materials 32 and 42 from material 22.

HGRAM cell 10 includes an hourglass-shaped material 22 having three regions, an upper region connected via a bridge region 23 to a lower region. Bridge region 23, shown in FIG. 1 as the pinched-in region of material 22, has a word clamp formed on one side and the bit clamp formed on the other side. Gates 34 and 44 provide a mechanism for controlling whether the word clamp and the bit clamp permit or prevent the movement of positive charges called holes across bridge region 23. It should be pointed out that bridge region 23 is narrow, such that a strong electrical field provided by each clamp may strongly influence the hole traversal across bridge region 23. By supplying the proper voltage potentials to gates 34 and 44, either clamp may prevent the migration of holes between the upper and lower regions of material 22. Stated differently, a proper bias supplied to both clamps through gates 34 and 44 allows movement of holes between the upper and lower regions, across bridge region 23. Also note that applying no voltage potential to gates 34 and 44 prevents holes from moving across bridge region 23.

HGRAM cell 10 may be arrayed, with memory cells along each row of the array commonly connected to a WORD line and memory cells located in a column commonly connected to a DATA line and a BIT line. In particular, a signal generated by an address decode circuit (not shown) is supplied on the memory WORD line to both gate 34 of the gate structure and to source region 18 of the NPN transistor regions. Data may be written and read on a DATA line that is connected to gate 24 of the gate structure and to drain region 20 of the NPN transistor regions, and further connected to sense amps (not shown).

In operation, in a write mode of a logical zero value into HGRAM cell 10, a negative charge may be applied to gates 34 and gate 44 and a data value of zero may be supplied to gate 24. The negative charge supplied to gates 34 and gate 44 forces the holes in materials 32 and 42 to the outer edge of the clamp, i.e. towards gates 34 and 44, and away from bridge region 23. The reduced number of holes near bridge region 23 reduces the clamp's constriction on the bridge. In other words, when both gates 34 and 44 receive a negative bias, the holes may freely move between the upper and lower regions of the hourglass (the clamps are open) and be evenly distributed throughout material 22. It should be pointed out that although the word clamp and the bit clamp are biased to allow holes to freely move throughout material 22, the data value of zero supplied to gate 24 attracts many of the holes to that gate and away from the lower region of material 22, and therefore, the channel region of substrate 16. Thus, when writing a logical zero value into HGRAM cell 10, a conduction channel is prevented from forming in the channel region of substrate 16. The DATA value supplied to gate 24 controls the distribution of charges between the upper and lower regions of material 22 and no conduction channel forms between source region 18 and drain region 20.

On the other hand, a logical one value may be written into HGRAM cell 10 by supplying a positively charged DATA value at gate 24. With the word clamp and the bit clamp biased with negative bias values to allow holes to freely move throughout material 22 (including bridge region 23), the positive bias supplied to gate 24 repels many of the holes away from that gate and into the lower region of material 22. In a read operation the increased number of holes in the lower region of material 22 causes the surface of the channel region of substrate 16 to become inverted and a conduction channel is form between source region 18 and drain region 20. Again, the DATA value supplied to gate 24 controls the distribution of charges between the upper and lower regions of material 22 and determines whether a conduction channel forms in the NPN transistor regions.

Clamps are closed unless they are actively being held open by their respective gates. Note that a clamp being closed implies that holes are restricted from moving across bridge region 23 and that a clamp being open implies that holes may move across bridge region 23. Further note that either (or both) the word clamp or the bit clamp may provide electric fields that inhibit holes from being transported through the narrow neck of bridge region 23. In general, data may be written and stored in HGRAM cell 10 by opening the clamps and supplying data to gate 24, then closing at least one of the clamps prior to removing the data from gate 24. A logical one may be written and stored in HGRAM cell 10 by supplying a positive data value to gate 24 and a logical zero may be written and stored by supplying a negative data value.

In a read mode of HGRAM cell 10, a negative bias may be supplied to gate 34 and source region 18. A zero stored in the memory cell does not form a conduction channel in the channel region of substrate 16, and accordingly, the NPN transistor conducts no current. On the other hand, a one stored in the memory cell does forms a conduction channel in the channel region of substrate 16 and the NPN transistor regions do conduct current. In general, stored data may be read from HGRAM cell 10 by supplying a negative bias to source region 18 and sensing whether the NPN transistor is biased to conduct a current.

Thus, the data value stored in HGRAM cell 10 may be read by providing a negative voltage on the WORD line and sensing whether current is conducted on the DATA line. As is commonly done with existing memory devices, the BIT line is not activated during read operations, so the BIT clamp remains closed. If there are insufficient holes in the lower region of material 22 (a logical zero value stored in HGRAM cell 10), the hourglass will not attract the electrons in the channel region of substrate 16 as an inversion layer to the top of the channel. Even though a negative bias on the WORD line is provided to source region 18, the lack of an electron channel between source region 18 and drain region 20 prevents any current from being conducted on the DATA line. On the other hand, if holes are concentrated in the lower region of material 22 (a logical one value stored in HGRAM cell 10), then the electrons in the P-channel region of substrate 18 will be drawn towards the upper part of the channel. With a channel formed between source region 18 and drain region 20, current may be conducted on the DATA line. It should be pointed out that the DATA line is connected to gate 24, but this gate does not overcome the clamping effect of the BIT clamp, which is not used in read operations. In essence, this means the DATA clamp does not corrupt the data stored in HGRAM cell 10 during a read operation.

When either (or both) of gates 34 and 44 receive a positive voltage (or no voltage) potential that close the clamps, the heavy doping in the materials 32 and 42 restrict the holes from redistributing themselves across bridge region 23, regardless of the polarity of the DATA supplied at gate 24. In this "rest state" for the clamp, holes are inhibited from traveling through bridge region 23, and thereby, a non-volatile state for HGRAM cell 10 is provided. The distribution of holes between the upper and lower regions remains fixed until the clamps are opened again. It should be pointed out that HGRAM cell 10 requires no memory refreshing, and therefore, saves memory bandwidth and reduces energy.

It should be further pointed out that HGRAM cells 10 retain memory values in the hourglass even when power is removed from the memory, based on the fact that the hourglass material 22 is insulated from materials 32 and 42, i.e., insulated from outside contacts. Thus, even with the power to HGRAM cells 10 removed, clamps 32 and 42 remain closed, so charges do not migrate across bridge region 23 and corrupt the stored value retained in the lower region of material 22.

FIG. 2 illustrates another embodiment of HGRAM cell 50 having a CLR gate 54 and a SET gate 56. In this embodiment SET gate 56 may receive a negative bias that attracts holes to the lower region of material 22 while a positive bias supplied to CLR gate 54 repels holes out of the upper region. Alternatively, SET gate 56 may receive a positive bias that repels holes out of the lower region of material 22 while a negative bias supplied to CLR gate 54 attracts holes to the upper region. The complemented signals at CLR gate 54 and SET gate 56 may quickly move holes through bridge region 23 and potentially decrease the programming time for HGRAM cell 50. Other variations of HGRAM cell 50 may include separating out the DATA line from the gate at the top of the cell (for easier fabrication or to minimize the residual impact of channel electron flow on the DATA gate), moving or adding DATA gates to just above the WORD and BIT gates, and re-aligning the WORD line for better row implementation. Additionally, positive voltage on the BIT line could be used to tighten the clamp and improve read speed.

HGRAM cell 10 may also be used in either single-bit or multi-bit operation that store two or more bits in a single cell. By controlling the time that the clamps are kept open during a write operation, it may be possible to distinguish between different concentrations of holes in the lower region of material 22. Thus, pulsing the biasing of the clamp for a length of time limits the charge passed to the lower region which in turn controls the current conducted by the field-effect device in providing multi-bit memory operation. For a multi-bit memory cell, the circuitry reading the DATA line (not shown) may sense different conduction currents, i.e., a measure of the strength of the inversion current in the channel region of substrate 16 and proportional to the concentration of holes stored in the lower region of material 22. Although HGRAM may not require a separate erase step for single-bit operation, supporting multi-bit operation may or may not require a separate erase step to ensure the proportional timing is measured off a consistent base. CLR gate 54 and SET gate 56 may balance offsetting attractions in the SET and CLR gates and eliminate a separate erase step.

FIG. 3 illustrates HGRAM cell 10 or HGRAM cell 50 incorporated into a memory of a computer system having an Operating System (OS) that may manage the limited physical memory present on the computer, dividing the physical memory among many processes that may be running simultaneously and allocating each process an appropriate memory share. The OS running on the microprocessor may rely on hardware support from a Memory Management Unit (MMU) to manage the memory and export functions that other subsystems and applications may use to interact with the memory.

By now it should be clear that embodiments have been presented for a memory cell that is non-volatile and compact. The HGRAM cell may be manufactured using current technologies without the need for exotic materials. The memory cells non-destructive write operation means it has virtually unlimited durability and may even be used for system memory applications.

While certain features of the invention have been illustrated and described herein, many modifications, substitutions, changes, and equivalents will now occur to those skilled in the art. For instance, HGRAM cell 10 has been shown and described for an N-channel MOS device with P-type clamp materials 32 and 42, but the present invention is applicable to a P-channel MOS device with N-type clamp materials and electron movement in material 22 rather than hole movement. It is, therefore, to be understood that the appended claims are intended to cover all such modifications and changes as fall within the true spirit of the invention.

What is claimed is:

1. A device, comprising:
   a substrate having source and drain regions;
   a semiconductor material having an upper region separated from a lower region by a bridge region, with the lower region formed at least over the substrate between the source and drain regions; and
   a first clamp material formed adjacent the bridge region to receive a bias that controls a charge passed between the upper region and the lower region, the first clamp material being separate from the source and drain regions.

2. The device of claim 1, wherein the semiconductor material is electrically isolated from the first clamp material.

3. The device of claim 1, wherein the semiconductor material is hourglass shaped with the bridge region narrower than the upper region and the lower region.

4. The device of claim 1, further including a gate coupled to the upper region of the semiconductor material.

5. The device of claim 4, wherein the gate coupled to the upper region of the semiconductor material is coupled to the drain region by a data line.

6. The device of claim 5, wherein a gate coupled to the first clamp material is coupled to the source region by a word line.

7. The device of claim 1, further including a second clamp material formed adjacent the bridge region and opposing the first clamp material.

8. A storage device, comprising:
   a substrate having a field-effect transistor with a source and a drain; and
   a gate structure having a semiconductor material with an upper region, a bridge region and a lower region positioned above the substrate and between the source and drain, the gate structure further including a clamp coupled to the bridge region to control charge passed from the upper region through the bridge region to the lower region, with charge in the lower region controlling an inversion layer formed between the source and drain; wherein the clamp is physically separate from the source and the drain.

9. The storage device of claim 8, further including a data line coupled to the upper region of the semiconductor material and the drain.

10. The storage device of claim 8, further including a word line coupled to the clamp material and the source.

11. The storage device of claim 8, further including coupling a first signal to the upper region and a second signal to the lower region of the semiconductor material.

12. A device, comprising:
   a substrate having source and drain regions separated by a channel region;
   a polysilicon material having an upper region, a lower region and a pinched-in region that connects the upper region to the lower region, with the lower region formed at least over the channel region: and a semiconductor material to receive a bias that controls the pinched-in region to pass a charge between the upper region and the lower region, wherein the semiconductor material is physically separate from the source and drain regions.

13. The device of claim 12, wherein the polysilicon material is hourglass shaped with the pinched-in region narrower than the upper region and the lower region.

14. The device of claim 12, further including a gate coupled to the upper region of the polysilicon material.

15. The device at claim 12, further including a gate coupled to the semiconductor material.

16. The device of claim 12, further including an insulating material between the pinched-in region of the polysilicon material and the semiconductor material.

* * * * *